United States Patent [19]

Shimp

[11] 4,072,899
[45] Feb. 7, 1978

[54] RF LEAK DETECTOR

[75] Inventor: Richard L. Shimp, Waynesboro, Va.

[73] Assignee: Comsonics, Inc., Harrisonburg, Va.

[21] Appl. No.: 680,412

[22] Filed: Apr. 26, 1976

[51] Int. Cl.² .................................................. H04B 17/00
[52] U.S. Cl. ................................ 325/67; 179/175.3 F;
324/52; 324/72.5; 324/95; 325/308; 358/86
[58] Field of Search ..................... 325/67, 363, 31, 308,
325/46, 131, 466; 178/DIG. 4, DIG. 13;
179/175.3 F; 324/52, 67, 72, 95, 51, 66, 72.5;
340/384 E

[56] References Cited

U.S. PATENT DOCUMENTS

| | | | |
|---|---|---|---|
| 3,453,533 | 7/1969 | Cox | 324/52 |
| 3,469,190 | 9/1969 | Rheinfelder | 325/67 |
| 3,551,804 | 12/1970 | Weddle | 324/52 |
| 3,651,403 | 3/1972 | Fluck, Jr. | 325/31 |
| 3,872,470 | 3/1975 | Hoerz et al. | 340/384 E |
| 3,882,287 | 5/1975 | Simmonds | 179/175.3 A |
| 3,908,165 | 9/1975 | Cauldwell | 325/67 |
| 3,991,363 | 11/1976 | Lathrop | 324/52 |

FOREIGN PATENT DOCUMENTS 1,172,683  12/1969  United Kingdom ................ 324/52

Primary Examiner—Robert L. Griffin
Assistant Examiner—Marc E. Bookbinder
Attorney, Agent, or Firm—Sughrue, Rothwell, Mion, Zinn and Macpeak

[57] ABSTRACT

The detector is primarily useful in detecting RF leaks due to defects in the shielding in a CATV coaxial cable distribution network. RF leaks are detected by transmitting a unique signal and using a very narrow band receiver to detect the unique signal to thereby detect small amounts of RF leakage from the CATV coaxial cable distribution network at the locations of defects in the shielding. The leakage from the CATV coaxial cable distribution network is due to defects in the shielding such as small cracks in the cable, loose fittings or other non-RF tight conditions. The detector is a three-part system including a transmitter, a remote cable powered preamp and antenna assembly, and a narrow band receiver providing an audio output. The transmitter is designed to be permanently installed at the head end location and is modulated with a unique audio tone. An RF leak is detected by moving the remote preamp and antenna assembly along the coaxial cable distribution network of the CATV system. When the remote preamp and antenna assembly picks up leakage RF energy, the unique audio tone will be detected, and the detected audio signal fed to a loud speaker or earphones. The audio tone is readily recognized by the operator.

12 Claims, 3 Drawing Figures

RF LEAK DETECTOR

BACKGROUND OF THE INVENTION

The present invention generally relates to RF test instruments, and more particularly to an RF leak detector which is particularly useful in detecting RF leaks in CATV coaxial cable distribution networks due to defects in shielding.

A continuing problem in high frequency communications networks both in their installation and maintenance is the necessity of assuring the integrity of the transmission line. This is particularly true in cable television systems where RF leaks in the CATV coaxial cable distribution networks can severely effect the quality of the received signal. Such leaks may be due to small cracks in the cable, loose fittings or other non-RF tight conditions.

RF detectors are, in general, known in the art. However because of the proliferation of RF generating equipment, such as for example but not limited to two-way radios, fluorescent lights and the like, erroneous detections of RF leaks are often made. On the one hand, prior art RF leak detectors may provide an indication of an RF leak in a cable when none exists, and on the other hand, the locally generated RF energy may be so strong as to prevent detection of an RF leak in the cable being tested.

SUMMARY OF THE INVENTION

It is therefore an object of the present invention to provide an RF leak detector which responds only to RF leaks in the equipment under test even in the presence of locally generated RF energy.

The foregoing and other objects are attained by transmitting a unique signal and using a very narrow band receiver to detect the unique sign thereby detect small amounts of RF leakage from the cable distribution networks under test. According to the preferred embodiment of the present invention, the transmitter, which is designed to be permanently installed at the head end location of a CATV system, is modulated with a unique audio tone. Coaxial cable sheath current sensing is accomplished with a remote cable powered preamp and antenna assembly, designed primarily for interception of coherent sheath currents. A high threshold AGC circuit is employed in the receiver to enhance peak signal detection. If there is an RF leak, the unique audio tone will be detected, and the detected audio signal is fed to a loud speaker or earphones. The audio tone is readily recognized by the operator.

BRIEF DESCRIPTION OF THE DRAWING

The specific nature of the invention, as well as other objects, aspects, uses and advantages thereof, will clearly appear from the following description and from the accompanying drawing, in which.

DESCRIPTION OF THE PREFERRED EMBODIMENT

Figures 1, 2, 3:
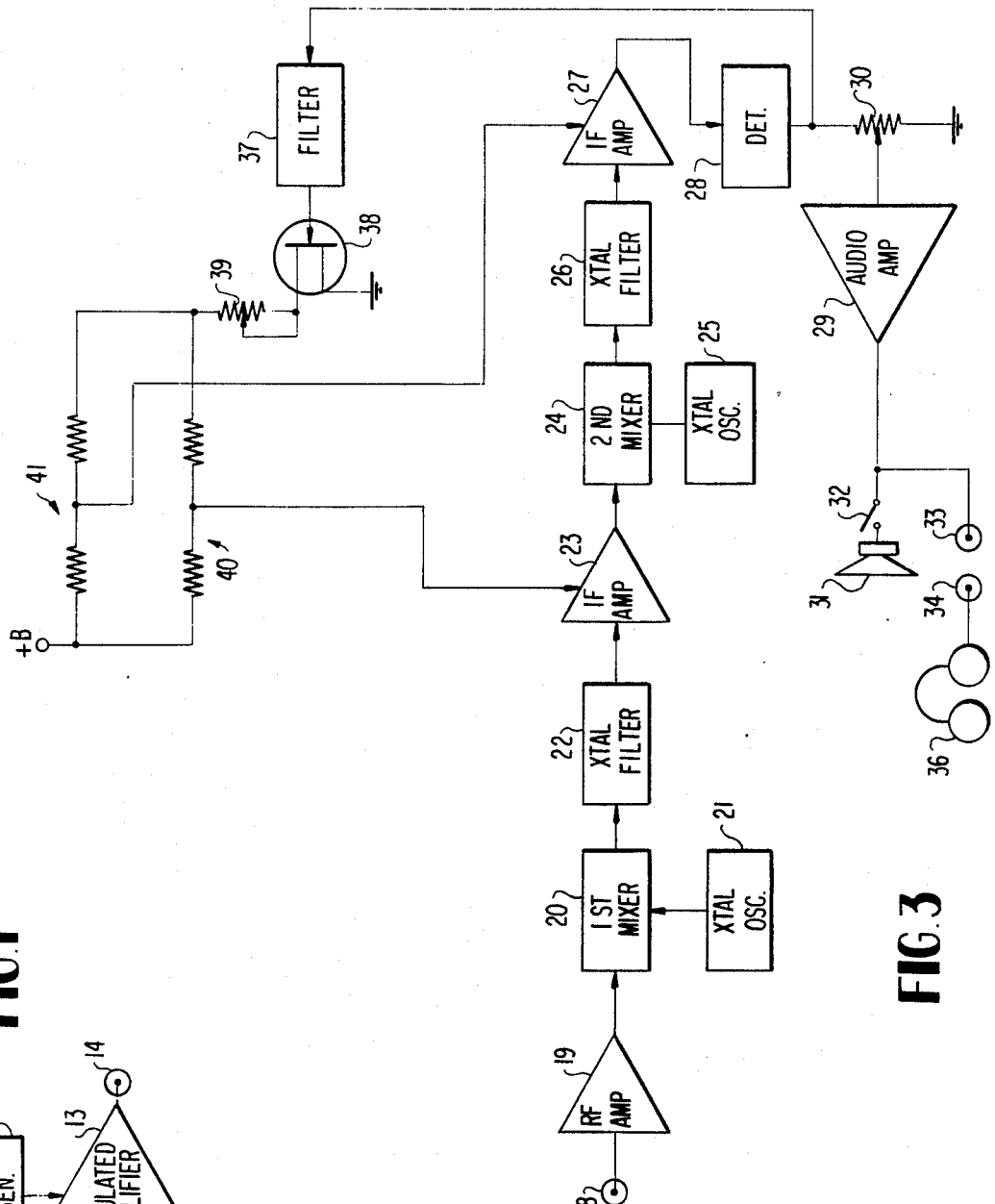
FIG. 1 is a block diagram of the transmitter according to the preferred embodiment of the invention.
FIG. 2 is a block and schematic diagram of the remote preamplifier and antenna assembly.
FIG. 3 is a block and schematic diagram of the receiver according to the invention.

Referring first to FIG. 1 of the drawing, the transmitter consists of a crystal controlled oscillator 10, an amplifier 11, an audio tone generator 12, and a modulated amplifier 13. The output from the crystal oscillator 10 is fed to the amplifier 11 which may comprise two or more amplifying stages. The audio tone generator 12 provides the modulation drive to the modulated amplifier 13. The modulated amplifier 13 may simply consist of one or more switching transistors which alternately applies and removes B+ power to the last stages. The last stage of the modulated amplifier 13 operates in class C and provides a nearly 100 percent modulated carrier at the output terminal 14.

The transmitter is designed to be permanently installed at the head or hub end of a CATV system. The audio tone generator 12 provides a unique warbling audio tone for modulating the transmitter RF output signal. Sufficient signal level and band-passing is incorporated in the modulated amplifier 13 to allow for any combining scheme or adjacent channel interference at the head end or hub location of the CATV system.

The actual sensing of the cable sheath current is accomplished by an extremely low noise preamp and antenna assembly shown in FIG. 2 which is connected to a very narrow band, high-sensitivity receiver shown in FIG. 3. More specifically, the antenna 15 is designed to be moved along the cable at a suspected point of radiation to cause interception of coherent sheath currents. A first RF preamplifier 16 is located in the antenna housing, and power for the preamplifier 16 is supplied via the cable interconnecting the preamplifier 16 and antenna assembly 15 with the receiver. This cable is coupled between the jacks 17 and 18. By placing the RF preamplifier 16 close to the antenna 15, a low noise signal at the input to the second RF amplifier 19 in the receiver is assured.

After amplification by the second RF amplifier 19 in the receiver, the signal is converted to a first IF signal by a first mixer 20 and local crystal oscillator 21. Only the desired mixing product, for example the difference product, is passed by the crystal filter 22 to the first IF amplifier 23. The IF signal is amplified by the amplifier 23 and coupled to the second mixer 24. A second crystal oscillator 25 provides the local oscillator input to the second mixer 24. The mixing products from the second mixer 24 are filtered by crystal filter 26 to provide an extremely sharp bandpass of ± 1KHz to the resultant 500KHz IF. A second IF amplifier 27 is employed to boost the filtered output signal from crystal filter 26, and this amplified signal is coupled to a detector circuit 28 which is biased to give maximum sensitivity.

After detection, the resultant signal is applied to an audio amplifier 29 through a volume control potentiometer 30. The output of the audio amplifier 29 may be used to drive an internal speaker 31 through an on-off switch 32, or the output of the amplifier may be connected via jacks 33 and 34 to earphones 36 worn by the operator.

The output of detector 28 is filtered in low-pass filter 37 to provide drive to a FET 38 in the AGC circuit. The FET 38 controls, via potentiometer 39, the voltage to two parallel resistive dividers 40 and 41. Divider 40 is connected to the AGC port of IF amplifier 23, while divider 41 is connected to the AGC port of IF amplifier 27. By adjusting the gain of amplifiers 23 and 27 separately, an improved signal to noise ratio can be realized. The AGC control provided by the FET 38 is modified by the potentiometer 39 which is a sensitivity control providing an increased dynamic range. The sensitivity control has no effect on AGC action since it only adjusts the operating point of the AGC circuit thereby enabling the signal to increase in level with decreasing distance to the radiation leak while still maintaining AGC action to peak levels regardless of signal strength.

The RF leak detector can be used to detect leaks in both aerial and underground cables. In operation, the sensitivity control potentiometer 39 is adjusted until the audible tone of the transmitter is heard. At this point, some adjustment of the volume potentiometer 30 may be required. By moving the antenna 15 along the cable, a point of maximum signal level can be detected.

While the invention has been described in terms of a preferred embodiment used for detecting RF leaks in a CATV system, those skilled in the art will recognize that the invention may be used to detect RF leaks in other and different equipment. It will therefore be apparent that the embodiment shown is only exemplary and that various modifications can be made in construction and arrangement within the scope of the invention as defined in the appended claims.

What is claimed is:

1. A method of detecting RF leaks due to defects in the shielding of a coaxial RF communications medium comprising the steps of:
   applying an RF signal, which is modulated by a unique signal, to the coaxial RF communications medium, and
   detecting said unique signal with a narrow band receiver and antenna to thereby detect small amounts of RF leakage from the coaxial RF communications medium at the locations of defects in the shielding.

2. A method as recited in claim 1, wherein said unique signal is a warbling audio tone and said step of detecting includes the further step of aurally reproducing said warbling audio tone.

3. A system for detecting RF leaks due to defects in the shielding of a coaxial RF communications medium comprising:
   means for applying an RF signal, which is modulated by a unique signal, to the coaxial RF communications medium,
   movable antenna means for receiving any RF leakage from the coaxial RF communications system, and
   receiver means connected to said movable antenna means for detecting said unique signal to thereby detect small amounts of RF leakage from the coaxial RF communications medium at the locations of defects in the RF shielding.

4. A system as recited in claim 3, wherein said unique signal is a warbling audio tone and said receiver means includes
   a detector for detecting said warbling audio tone modulation on the received RF leakage, and
   audio means connected to the output of said detector for aurally reproducing the detected warbling audio tone.

5. A system as recited in claim 4 wherein said receiver means further includes
   a narrow bandpass IF amplifier and filter connected between said movable antenna means and said detector, and
   AGC means connected to the output of said detector for controlling the gain of said IF amplifier, said AGC means being adjustable to vary the dynamic range of said receiver means.

6. An RF leak detector for CATV systems of the type having a transmitter located at a head end and a coaxial cable distribution network emanating from said head end to a plurality of subscriber's terminals, said detector comprising:
   means located at said head end for generating an RF signal which is modulated by a unique signal,
   means for coupling the modulated RF signal to said distribution network,
   antenna means adapted to be moved proximate to the coaxial cable distribution network for receiving any RF leakage due to defects in the shielding of the coaxial cable distribution network, and
   receiver means connected to said antenna means for detecting said unique signal to thereby detect small amounts of RF leakage from the coaxial cable distribution network at locations of defects in the shielding of the coaxial cable distribution network.

7. A detector as recited in claim 6 wherein said unique signal is a warbling audio tone and said receiver means includes
   a detector for detecting said warbling audio tone modulation on the received RF leakage from the sheathed cable, and
   audio means connected to the output of said detector for aurally reproducing the detected warbling tone.

8. A detector as recited in claim 7 wherein said audio means is adjustable to vary the volume of the reproduced warbling audio tone and said receiver means further includes
   a narrow bandpass IF amplifier and filter connected between said movable antenna means and said detector, and
   AGC means connected to the output of said detector for controlling the gain of said IF amplifier, said AGC means being adjustable to vary the dynamic range of said receiver means.

9. A detector as recited in claim 8 wherein said audio means includes earphones to be worn by an operator.

10. A method of detecting RF leaks due to defects in the shielding of coaxial cables of CATV systems of the type having a transmitter located at a head end and a coaxial cable distribution network emanating from said head end to subscribers' terminals, said method comprising the steps of
    generating an RF signal which is modulated by a unique warbling audio tone at the head end,
    coupling the modulated RF signal into said coaxial cable distribution network,
    moving an antenna along the coaxial cable distribution network to receive any leakage RF energy from the coaxial cable distribution network,
    detecting said unique warbling audio tone to thereby detect small amounts of RF leakage from the coaxial cable distribution network at the locations of defects in the shielding of the coaxial cable distribution network.

11. In an RF leak detecting system for locating RF leakage due to defects in the shielding of coaxial cables in CATV systems of the type having a transmitter located at a head end and a coaxial cable distribution network emanating from said head end to a plurality of subscribers' terminals, said RF leak detecting system including an antenna adapted to be moved proximate to coaxial cable distribution network for receiving any RF leakage from the coaxial cable, distribution network, and a receiver connected to said antenna, the improvement comprising:

means located at said head end for generating an RF signal which is modulated by a unique audio signal, and means for coupling the modulated RF signal to said coaxial cable distribution network, said receiver being tuned to said RF signal and capable of detecting and aurally producing said unique audio signal at the locations of defects in the shielding of the coaxial cable distribution network.

12. A device for use with a movable antanna for receiving RF leakage due to defects in the shielding of a coaxial RF communications medium and a receiver connected to said movable antanna, said device comprising:

means for generating an RF signal which is modulated by a unique signal, and means for coupling the modulated RF signal to the coaxial RF communications medium, said receiver being tuned to said RF signal and capable of detecting said unique signal at the locations of defects in the shielding of the coaxial RF communications medium.

* * * * *